(12) United States Patent
Wu et al.

(10) Patent No.: US 10,030,301 B2
(45) Date of Patent: Jul. 24, 2018

(54) UPRIGHT TARGET STRUCTURE AND SPUTTERING EQUIPMENT

(71) Applicant: CHUNGHWA PICTURE TUBES, LTD., Taoyuan (TW)

(72) Inventors: Hsi-Yu Wu, Taoyuan (TW); Po-Hsu Tsai, New Taipei (TW)

(73) Assignee: CHUNGHWA PICTURE TUBES, LTD., Taoyuan (TW)

( * ) Notice: Subject to any disclaimer, the term of this patent is extended or adjusted under 35 U.S.C. 154(b) by 47 days.

(21) Appl. No.: 15/185,032

(22) Filed: Jun. 17, 2016

(65) Prior Publication Data
US 2017/0335447 A1 Nov. 23, 2017

(30) Foreign Application Priority Data

May 17, 2016 (CN) .................... 2016 2 0450325 U

(51) Int. Cl.
C23C 14/34 (2006.01)
C23C 14/35 (2006.01)
H01J 37/34 (2006.01)

(52) U.S. Cl.
CPC .......... *C23C 14/3407* (2013.01); *C23C 14/35* (2013.01); *H01J 37/3423* (2013.01)

(58) Field of Classification Search
CPC .................................................. H01J 37/3423
See application file for complete search history.

(56) References Cited

U.S. PATENT DOCUMENTS

| 4,244,064 A | * | 1/1981 | Parr ..................... A47K 17/028 |
| | | | 4/254 |
| 4,820,397 A | * | 4/1989 | Fielder ................ C23C 14/3407 |
| | | | 204/298.09 |
| D307,800 S | * | 5/1990 | Hradisky ....................... D25/65 |

FOREIGN PATENT DOCUMENTS

CN 201512578 U 6/2010
TW M394991 U 12/2010

* cited by examiner

*Primary Examiner* — Jason Berman
(74) *Attorney, Agent, or Firm* — CKC & Partners Co., Ltd.

(57) ABSTRACT

An upright target structure includes a target main body. The target main body has a first surface and a second surface opposite to each other. The first surface is configured to connect with a back plate. The target main body further has a third surface, a fourth surface, a fifth surface and a sixth surface. The third surface connects with the first surface and the second surface. The fourth surface is opposite to the third surface and connects with the first surface. The fifth surface is opposite to the third surface and connects with the second surface. The sixth surface connects with the fourth surface and the fifth surface. The sixth surface is away from the first surface as getting close to the fifth surface.

6 Claims, 4 Drawing Sheets

UPRIGHT TARGET STRUCTURE AND SPUTTERING EQUIPMENT

RELATED APPLICATIONS

This application claims priority to Chinese Application Ser. No. 201620450325.4, filed May 17, 2016, which is herein incorporated by reference.

BACKGROUND

Technical Field

The present disclosure relates to an upright target structure and a sputtering equipment applying thereof. More particularly, the present disclosure relates to an upright target structure and a sputtering equipment applied in a magnetron sputtering system.

Description of Related Art

The technology of thin film deposition is one of the commonly applied technologies in the semiconductor industry. Thin film deposition can be classified into physical vapor deposition (PVD) and chemical vapor deposition (CVD). Meanwhile, evaporation and sputtering are currently the main streams for the physical vapor deposition. The basic principle of sputtering is to turn the process gas located between two electrodes by a high voltage into the plasma. Afterwards, the ions of high energy are utilized to bombard on the target as the cathode, such that the molecules of the target become gasified or become single particles. Consequently, the molecules of the target are deposited on a surface of a substrate by methods such as diffusion to form a uniform film. Since metallic material or non-metallic material can be adopted as the target in a sputtering process, the sputtering process has been popularly applied in different industries.

Currently, there exists a magnetron sputtering machine which bombards the target with particles possessing kinetic energy in a vacuum condition as the coating principle. Thus, the material on the surface of the target (the material intended to deposit) comes out and sticks on the substrate (object to be deposited) to form a thin film thereon.

SUMMARY

A technical aspect of the present disclosure provides an upright target structure which can reduce the chance that the back spattered materials or the by-products fall to the second surface of the target main body.

According to an embodiment of the present disclosure, an upright target structure includes a target main body. The target main body has a first surface and a second surface opposite to each other. The first surface is configured to connect with a back plate. The target main body further has a third surface, a fourth surface, a fifth surface and a sixth surface. The third surface connects with the first surface and the second surface. The fourth surface is opposite to the third surface and connects with the first surface. The fifth surface is opposite to the third surface and connects with the second surface. The sixth surface connects with the fourth surface and the fifth surface. The sixth surface is away from the first surface as getting close to the fifth surface.

In one or more embodiments of the present disclosure, the fifth surface is substantially perpendicular to the second surface.

In one or more embodiments of the present disclosure, the sixth surface and the fifth surface form an obtuse angle.

In one or more embodiments of the present disclosure, a first distance between the third surface and an intersection of the fourth surface and the first surface is larger than a second distance between the third surface and an intersection of the fifth surface and the second surface.

In one or more embodiments of the present disclosure, the target main body further has an effective sputtering zone and a non-effective sputtering zone. The non-effective sputtering zone partially surrounds the effective sputtering zone. The effective sputtering zone is located on the second surface.

In one or more embodiments of the present disclosure, the target main body further has at least one groove located on the fifth surface.

According to an embodiment of the present disclosure, a sputtering equipment includes a back plate, a magnetic element and an upright target structure. The magnetic element is configured to produce a magnetic field to the back plate. The upright target structure includes a target main body. The target main body has a first surface and a second surface opposite to each other. The first surface is configured to connect with a side of the back plate opposite to the magnetic element. The target main body further has a third surface, a fourth surface, a fifth surface and a sixth surface. The third surface connects with the first surface and the second surface. The fourth surface is opposite to the third surface and connects with the first surface. The fifth surface is opposite to the third surface and connects with the second surface. The sixth surface connects with the fourth surface and the fifth surface. The sixth surface is away from the first surface as getting close to the fifth surface.

In one or more embodiments of the present disclosure, the fifth surface is substantially perpendicular to the second surface.

In one or more embodiments of the present disclosure, the sixth surface and the fifth surface form an obtuse angle.

In one or more embodiments of the present disclosure, a first distance between the third surface and an intersection of the fourth surface and the first surface is larger than a second distance between the third surface and an intersection of the fifth surface and the second surface.

In one or more embodiments of the present disclosure, the target main body further has an effective sputtering zone and a non-effective sputtering zone. The non-effective sputtering zone partially surrounds the effective sputtering zone. The effective sputtering zone is located on the second surface.

In one or more embodiments of the present disclosure, the target main body further has at least one groove located on the fifth surface.

When compared with the prior art, the above-mentioned embodiments of the present disclosure have at least the following advantages: since the inclined sixth surface connects with the fifth surface, the back spattered materials or the by-products falling along the sixth surface will fall to the fifth surface. Furthermore, since the fifth surface is substantially perpendicular to the second surface, the back spattered materials or the by-products can be easily accumulated on the fifth surface. As a result, the chance that the back spattered materials or the by-products fall from the sixth surface to the second surface of the target main body and even stick to the second surface is effectively reduced. In this way, the yield rate of the sputtering procedure of the sputtering equipment is effectively increased, and the yield loss of the end products is correspondingly reduced.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
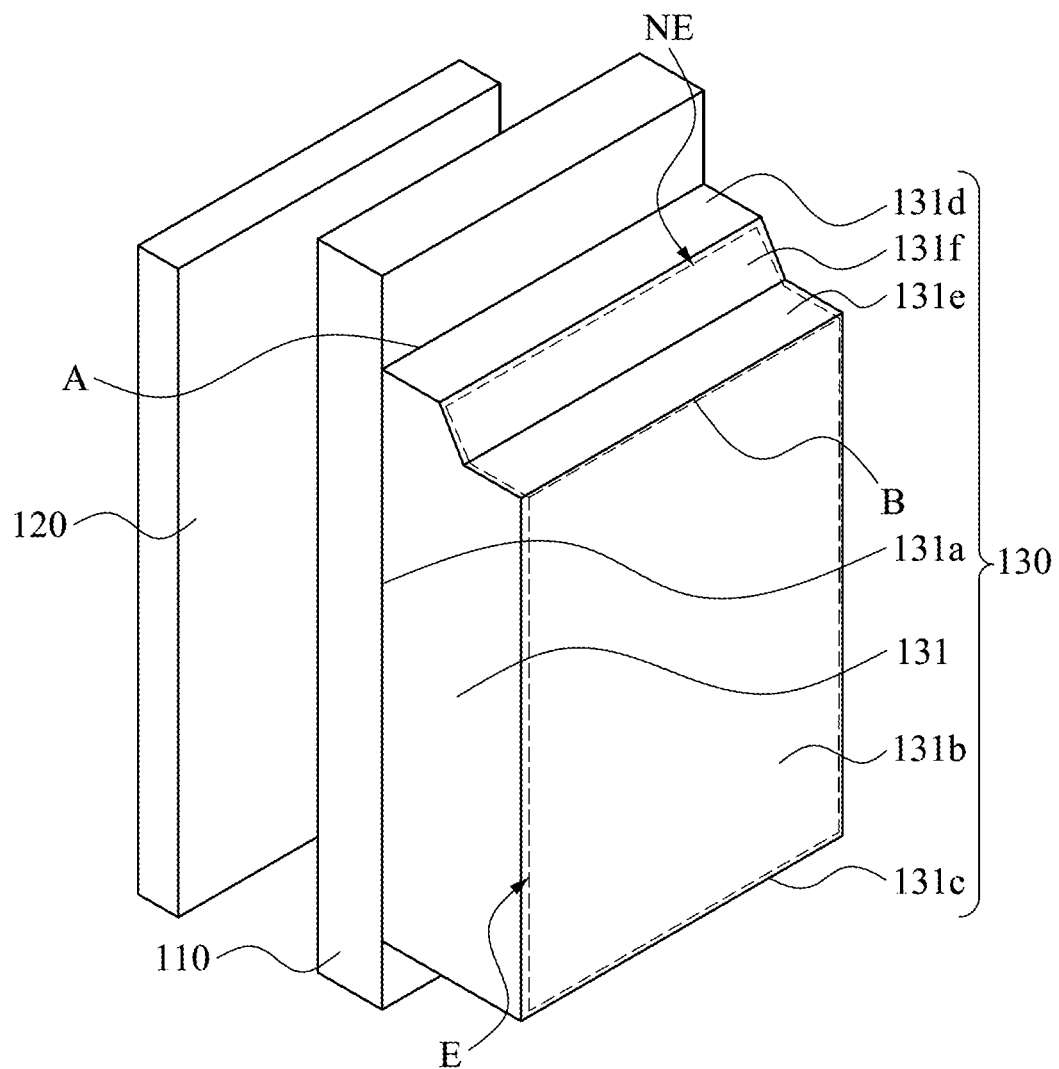
FIG. 1 is a schematic diagram of a sputtering equipment according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
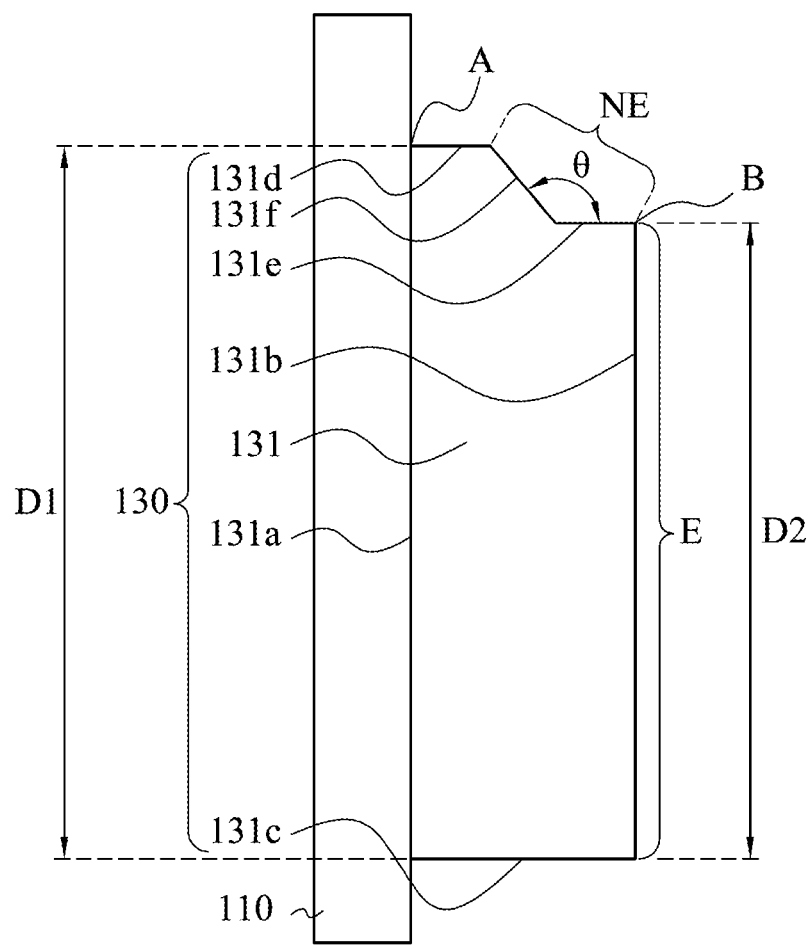
FIG. 2 is a side view of the upright target structure and the back plate of FIG. 1.

Reference is made to FIGS. 1-2. FIG. 1 is a schematic diagram of a sputtering equipment 100 according to an embodiment of the present disclosure. FIG. 2 is a side view of the upright target structure 130 and the back plate 110 of FIG. 1. As shown in FIGS. 1-2, a sputtering equipment 100 includes a back plate 110, a magnetic element 120 and an upright target structure 130. The magnetic element 120 is configured to produce a magnetic field towards the back plate 110. The upright target structure 130 includes a target main body 131. The target main body 131 has a first surface 131a and a second surface 131b opposite to each other. The first surface 131a is configured to connect with a side of the back plate 110 opposite to the magnetic element 120. The target main body 131 further has a third surface 131c, a fourth surface 131d, a fifth surface 131e and a sixth surface 131f. The third surface 131c connects with the first surface 131a and the second surface 131b. The fourth surface 131d is opposite to the third surface 131c and connects with the first surface 131a. The fifth surface 131e is opposite to the third surface 131c and connects with the second surface 131b. The sixth surface 131f connects with the fourth surface 131d and the fifth surface 131e. The sixth surface 131f is away from the first surface 131a as getting close to the fifth surface 131e. In practical applications, the arrangement direction of the upright target structure 130 is vertical. The third surface 131c of the target main body 131 faces downwards, while the fourth surface 131d and the fifth surface 131e face upwards.

On the other hand, structurally speaking, a first distance D1 between the third surface 131c and an intersection A of the fourth surface 131d and the first surface 131a is larger than a second distance D2 between the third surface 131c and an intersection B of the fifth surface 131e and the second surface 131b. As a result, as mentioned above, the sixth surface 131f is away from the first surface 131a as getting close to the fifth surface 131e.

In practical applications, during the operation of the sputtering equipment 100, electrons collide with plasma and produce ions of high energy. Bombardment is then carried out against the target main body 131 of the upright target structure 130 by the ions of high energy. Thus, the molecules of the target main body 131 become gasified or become single particles due to the bombardment, and consequently deposit on the surface of a substrate (not shown) to forming a thin film on the surface of the substrate. In this embodiment, the electrons are influenced by the magnetic field produced by the magnetic element 120 towards the back plate 110, such that the moving loci of the electrons become spiral in shape and the moving routes of the electrons are increased. Thus, the probability of collision between the electrons and the plasma is increased, such that more ions of high energy are produced for the bombardment against the target main body 131. Consequently, the sputtering efficiency of the target main body 131 is increased, and the formation of film is speeded up.

In addition, the target main body 131 of the upright target structure 130 further has an effective sputtering zone E and a non-effective sputtering zone NE. Being influenced by the magnetic field produced by the magnetic element 120 towards the back plate 110, bombardment by ions of high energy is carried out in the effective sputtering zone E, as compared to the non-effective sputtering zone NE. Furthermore, the non-effective sputtering zone NE partially surrounds the effective sputtering zone E. As shown in FIGS. 1-2, the non-effective sputtering zone NE is located at the top of the target main body 131. Preferably, in this embodiment, the non-effective sputtering zone NE is located at the fifth surface 131e and the sixth surface 131f. The effective sputtering zone E is located on the second surface 131b. In practical applications, the fourth surface 131d located beside the non-effective sputtering zone NE is covered by a baffle (not shown).

In this embodiment, the first surface 131a and the second surface 131b are substantially parallel with each other. The third surface 131c and the fourth surface 131d are respectively perpendicular to the first surface 131a substantially. To be more specific, the sixth surface 131f and the fifth surface 131e form an obtuse angle θ, i.e., an angle formed between the sixth surface 131f and the fifth surface 131e is larger than 90 degree. Therefore, the sixth surface 131f is inclined relative to the second surface 131b. In this way, the back spattered materials or the by-products formed on the sixth surface 131f because of the bombardment by the ions of high energy on the second surface 131b and then back spattered to the sixth surface 131f from the second surface 131b, will fall along the inclined sixth surface 131f, under the effect of factors such as subsequent bombardments or thermal expansion and contraction. It is worth mentioning that the fifth surface 131e is substantially perpendicular to the second surface 131b.

In addition, since the inclined sixth surface 131f connects with the fifth surface 131e, the back spattered materials or the by-products falling along the sixth surface 131f will fall to the fifth surface 131e. Furthermore, as mentioned above, since the fifth surface 131e is substantially perpendicular to the second surface 131b, the back spattered materials or the by-products can be easily accumulated on the fifth surface 131e. As a result, the chance that the back spattered materials or the by-products fall from the sixth surface 131f to the second surface 131b of the target main body 131 and even stick to the second surface 131b is effectively reduced. In this way, the yield rate of the sputtering procedure of the sputtering equipment 100 is effectively increased, and the yield loss of the end products is correspondingly reduced.

In this embodiment, the magnetic element 120 can be moved relative to the upright target structure 130. Thus, the lines of magnetic field can be moved relative to the upright target structure 130 during the operation of the sputtering equipment 100. In this way, the bombardments against the target main body 131 can be carried out evenly by the ions of high energy with respect to the change of the positions of the lines of magnetic field. Therefore, the evenness of wearing of the target main body 131 due to the bombardments by the ions of high energy is increased.

In practical applications, for example, the material of the target main body 131 can be chromium (Cr), aluminum (Al), molybdenum (Mo), composite metallic target such as molybdenum-niobium (Mo—Nb) and other appropriate metals. In other embodiments, the material of the target main body 131 can also be non-metals. However, this does not intend to limit the present disclosure.

Figure 3:
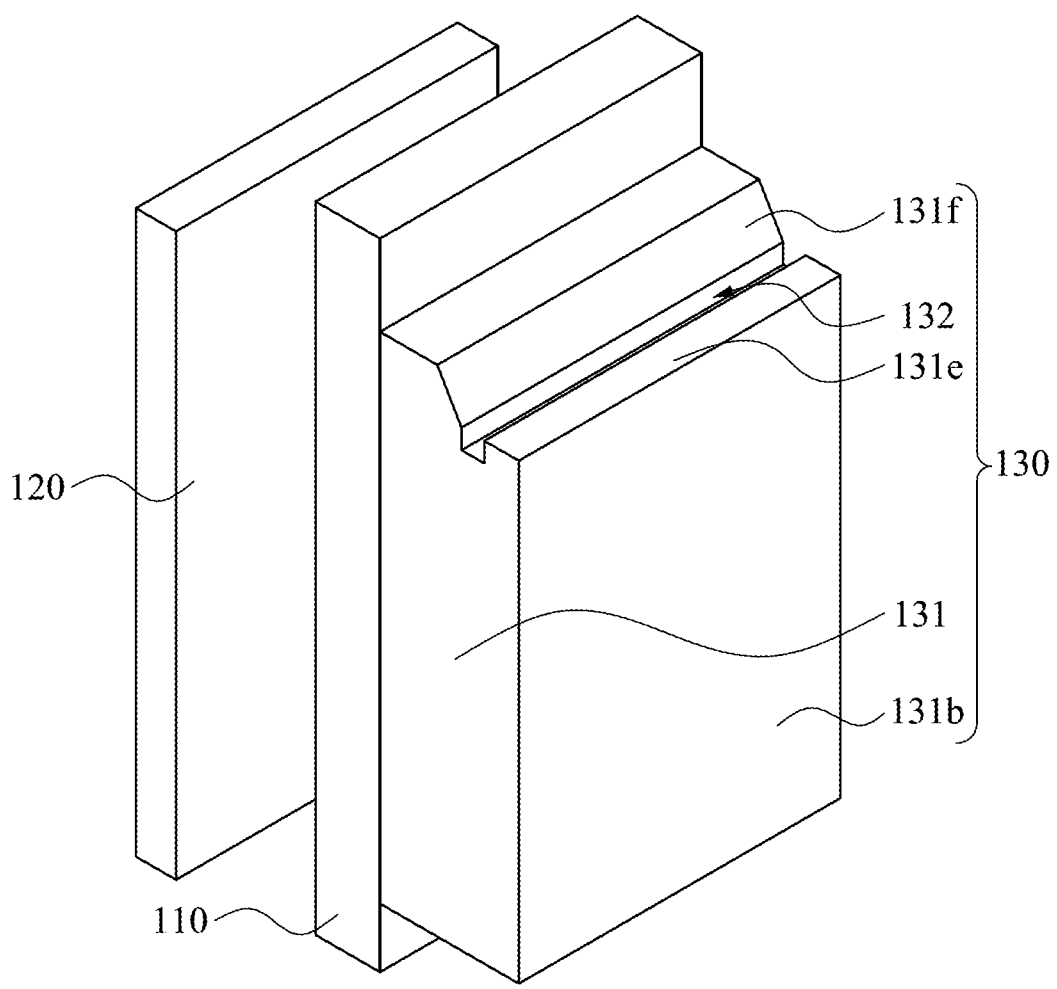
FIG. 3 is a schematic diagram of a sputtering equipment according to another embodiment of the present disclosure.

Reference is made to FIG. 3. FIG. 3 is a schematic diagram of a sputtering equipment 100 according to another embodiment of the present disclosure. As shown in FIG. 3, the target main body 131 further has at least one groove 132. The groove 132 is located on the fifth surface 131e of the target main body 131. As a result, when the back spattered materials or the by-products formed on the sixth surface 131f fall along the inclined sixth surface 131f, the back spattered materials or the by-products fall to the groove 132 and are accumulated in the groove 132. As a result, the chance that the back spattered materials or the by-products fall from the sixth surface 131f to the second surface 131b of the target main body 131 and even stick to the second surface 131b is effectively reduced. In this way, the yield rate of the sputtering procedure of the sputtering equipment 100 is effectively increased, and the yield loss of the end products is correspondingly reduced.

Figure 4:
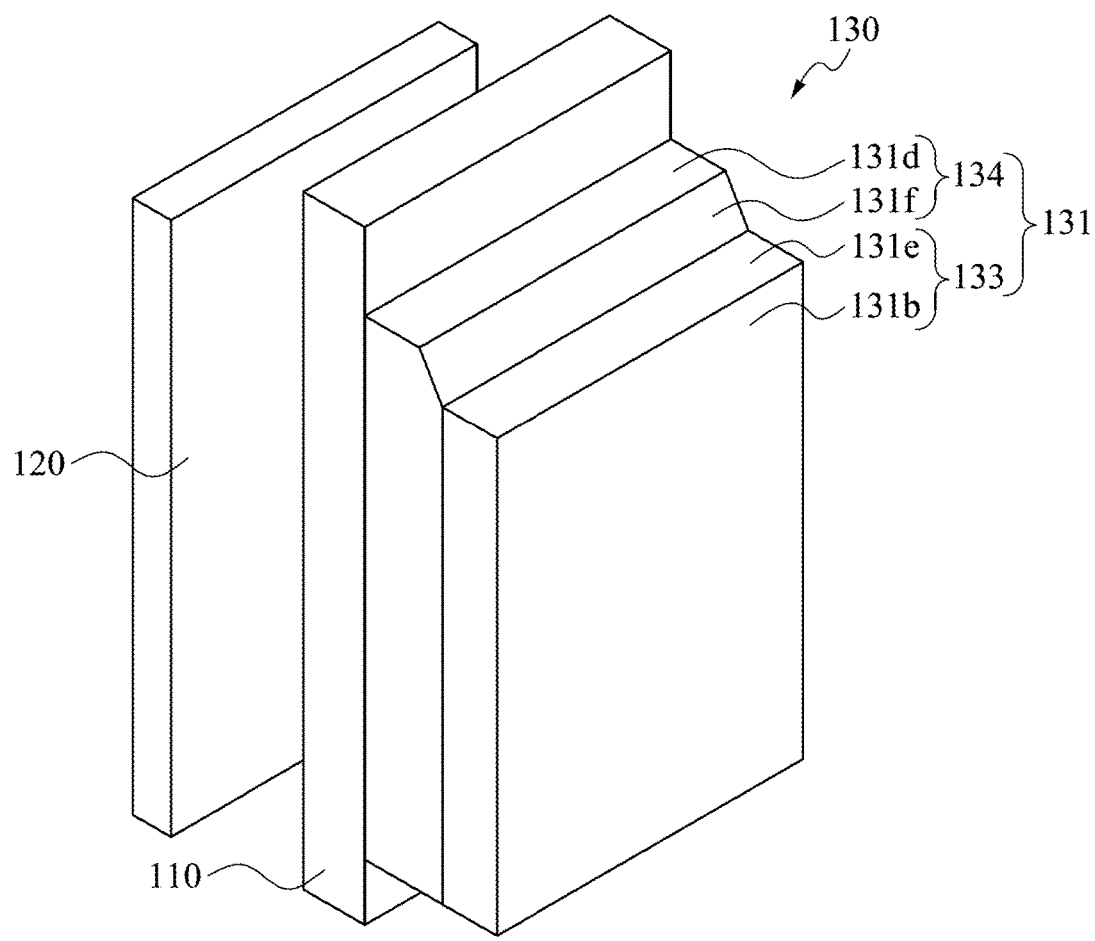
FIG. 4 is a schematic diagram of a sputtering equipment according to a further embodiment of the present disclosure.

Reference is made to FIG. 4. FIG. 4 is a schematic diagram of a sputtering equipment 100 according to a further embodiment of the present disclosure. As shown in FIG. 4, the target main body 131 further includes a first subsidiary target main body 133 and a second subsidiary target main body 134. The first subsidiary target main body 133 has the second surface 131b and the fifth surface 131e. The fifth surface 131e and the second surface 131b are mutually connected and are mutually perpendicular substantially. The second subsidiary target main body 134 has the fourth surface 131d and the sixth surface 131f on the top. The fourth surface 131d and the sixth surface 131f are mutually connected. The sixth surface 131f and the fifth surface 131e are mutually connected and are inclined relative to the fifth surface 131e, i.e., inclined relative to the second surface 131b. In other words, apart from the embodiments as mentioned above that the target main body 131 is integrally produced, the target main body 131 can also be formed by the composition of the first subsidiary target main body 133 and the second subsidiary target main body 134 as in this embodiment. In practical applications, the application of the first subsidiary target main body 133 and the second subsidiary target main body 134 can be of the same material. On the other hand, the user can also apply different materials according to the actual conditions. However, this does not intend to limit the present disclosure.

In conclusion, when compared with the prior art, the embodiments of the present disclosure mentioned above have at least the following advantage: since the inclined sixth surface connects with the fifth surface, the back spattered materials or the by-products falling along the sixth surface will fall to the fifth surface. Furthermore, since the fifth surface is substantially perpendicular to the second surface, the back spattered materials or the by-products can be easily accumulated on the fifth surface. As a result, the chance that the back spattered materials or the by-products fall from the sixth surface to the second surface of the target main body and even stick to the second surface is effectively reduced. In this way, the yield rate of the sputtering procedure of the sputtering equipment is effectively increased, and the yield loss of the end products is correspondingly reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:
1. A sputtering equipment, comprising:
   a back plate;
   a magnetic element configured to produce a magnetic field to the back plate; and
   an upright target structure comprising a target main body, the target main body having a first surface and a second surface opposite to each other, the first surface being configured to connect with a side of the back plate opposite to the magnetic element, the target main body further having a third surface, a fourth surface, a fifth surface and a sixth surface, the third surface connecting with the first surface and the second surface, the fourth surface being opposite to the third surface and connecting with the first surface, the fifth surface being opposite to the third surface and connecting with the second surface, wherein the fourth surface is a horizontal surface at higher elevation than the fifth surface relative to the third surface, and the sixth surface connects between the fourth surface and the fifth surface and is inclined to the fifth surface.

2. The sputtering equipment of claim 1, wherein the fifth surface is substantially perpendicular to the second surface.

3. The sputtering equipment of claim 1, wherein the sixth surface and the fifth surface form an obtuse angle.

4. The sputtering equipment of claim 1, wherein a first distance between the third surface and an intersection of the fourth surface and the first surface is larger than a second distance between the third surface and an intersection of the fifth surface and the second surface.

5. The sputtering equipment of claim 1, wherein the target main body further has an effective sputtering zone and a non-effective sputtering zone, the non-effective sputtering zone partially surrounds the effective sputtering zone, the effective sputtering zone is located on the second surface.

6. The sputtering equipment of claim 1, wherein the target main body further has at least one groove located on the fifth surface.

\* \* \* \* \*